United States Patent
Jo et al.

(10) Patent No.: US 9,751,988 B2
(45) Date of Patent: Sep. 5, 2017

(54) REACTIVE SILICONE COMPOSITION, HOTMELT MATERIAL MADE THEREFROM, AND CURABLE HOTMELT COMPOSITION

(71) Applicants: Dow Corning Corporation, Midland, MI (US); Dow Corning Toray Co., Ltd., Tokyo (JP)

(72) Inventors: Gunn Jo, Chungcheongbuk-do (KR); Haruna Yamazaki, Ichihara-shi (KR); Ju Young Yook, Gwanghyewon-Myeon (KR); Makoto Yoshitake, Ichihara-shi (KR)

(73) Assignees: DOW CORNING TORAY CO., LTD., Chiyoda-Ku, Tokyo (JP); DOW CORNING CORPORATION, Midland, MI (US)

( * ) Notice: Subject to any disclaimer, the term of this patent is extended or adjusted under 35 U.S.C. 154(b) by 0 days.

(21) Appl. No.: 15/115,923

(22) PCT Filed: Feb. 16, 2015

(86) PCT No.: PCT/US2015/016026
§ 371 (c)(1),
(2) Date: Aug. 2, 2016

(87) PCT Pub. No.: WO2015/126780
PCT Pub. Date: Aug. 27, 2015

(65) Prior Publication Data
US 2017/0166701 A1    Jun. 15, 2017

(30) Foreign Application Priority Data
Feb. 19, 2014   (KR) .................. 10-2014-0018842

(51) Int. Cl.
C08G 77/38 (2006.01)
H01L 23/29 (2006.01)
C08G 77/20 (2006.01)
C08L 83/04 (2006.01)
C08G 77/08 (2006.01)

(52) U.S. Cl.
CPC ............ *C08G 77/38* (2013.01); *C08G 77/20* (2013.01); *C08L 83/04* (2013.01); *C08G 77/08* (2013.01); *C08G 2170/20* (2013.01); *C08K 2201/00* (2013.01); *H01L 23/296* (2013.01)

(58) Field of Classification Search
None
See application file for complete search history.

(56) References Cited

U.S. PATENT DOCUMENTS

| 5,190,827 | A | * | 3/1993 | Lin | .................. C09J 183/04 428/447 |
|---|---|---|---|---|---|
| 2004/0116640 | A1 | | 6/2004 | Miyoshi | |
| 2007/0106016 | A1 | * | 5/2007 | Zhu | .................. A43B 13/04 524/588 |
| 2007/0112147 | A1 | | 5/2007 | Morita et al. | |
| 2008/0308828 | A1 | | 12/2008 | Kashiwagi et al. | |
| 2009/0118440 | A1 | | 5/2009 | Nakanishi et al. | |
| 2010/0331483 | A1 | | 12/2010 | Briehn et al. | |
| 2011/0092647 | A1 | * | 4/2011 | Morita | .................. C08G 77/50 525/100 |
| 2011/0248312 | A1 | | 10/2011 | Katayama | |
| 2012/0247033 | A1 | * | 10/2012 | Nakajima | .................. C09D 183/04 52/58 |
| 2012/0261068 | A1 | | 10/2012 | Kashiwagi | |
| 2013/0071591 | A1 | | 3/2013 | Yamamoto et al. | |
| 2013/0323428 | A1 | * | 12/2013 | Ochs | .................. C08L 83/04 427/331 |

OTHER PUBLICATIONS

International Search Report for Application No. PCT/US2015/016026 dated Apr. 24, 2015, 4 pages.

* cited by examiner

*Primary Examiner* — Marc Zimmer
(74) *Attorney, Agent, or Firm* — Howard & Howard Attorneys PLLC

(57) ABSTRACT

This invention relates to a reactive silicone composition for forming a hotmelt material, comprising: (A) an organopolysiloxane resin represented by the specific average unit formula; (B) an organopolysiloxane resin free of alkenyl group and represented by the specific average unit formula; (C) a diorganopolysiloxane represented by the specific average formula; (D) an organohydrogenpolysiloxane having two silicon-bonded hydrogen atoms in a molecule; (E) an organohydrogenpolysiloxane having at least three silicon-bonded hydrogen atoms in a molecule; and (F) a hydrosilylation catalyst. The reactive silicone composition can be reacted to form a hotmelt material having excellent shelf life stability, instant adhesion performance by hotmelt process.

6 Claims, No Drawings

REACTIVE SILICONE COMPOSITION, HOTMELT MATERIAL MADE THEREFROM, AND CURABLE HOTMELT COMPOSITION

CROSS-REFERENCE TO RELATED APPLICATIONS

This application is the National Stage of International Patent Application No. PCT/US2015/016026, filed on Feb. 16, 2015, which claims priority to and all the advantages of Korean Patent Application No. 10-2014-0018842, filed on Feb. 19, 2014, the content of which is incorporated herein by reference.

TECHNICAL FIELD

The present invention relates to a reactive silicone composition for forming a hotmelt material, a hotmelt material made therefrom, and a curable hotmelt composition comprising the same.

BACKGROUND ART

Curable silicone compositions are known for their excellent properties, such as resistance to heat and to cold, electrical insulation properties, weatherproof properties, repellency of water, transparency, etc. Due to these properties, the compositions find wide application in various industries. Since the compositions are superior to other organic materials with regard to their color change and deterioration of physical properties, one can expect that such compositions will find use as a material for optical parts. For example, US Patent Application Publication No. 2004/116640 A1 discloses an optical silicone resin composition for light-emitting diodes (LEDs) comprising: a silicone resin having at least two silicon-bonded alkenyl groups in a molecule, an organohydrogensilane and/or organohydrogenpolysiloxane having at least two silicon-bonded hydrogen atoms in a molecule, and an addition reaction catalyst.

Recently, addition curable solid or semi-solid silicone materials are proposed to enable a new LED device fabrication process. For example, US Patent Application Publication No. 2008/0308828 A1 discloses an additional curable adhesive silicone resin composition comprising: an alkenyl group-containing organopolysiloxane resin; a silicon-bonded hydrogen atom-containing organohydrogenpolysiloxane resin; a platinum group metal-based catalyst; and a phosphor, and also discloses an adhesive composition sheet prepared by molding the composition. However, the composition is only limited to the use of a specific organopolysiloxane resin having linear polysiloxane segments in the structure. US Patent Application Publication No. 2011/0092647 A1 discloses a curable organopolysiloxane composition comprising: a solvent-soluble organopolysiloxane obtained by conducting a hydrosilylation reaction between an organopolysiloxane resin having at least two alkenyl groups in a molecule, and a diorganopolysiloxane having silicon-bonded hydrogen atoms at both molecular terminals; an organohydrogenpolysiloxane; and a hydrosilylation catalyst. US Patent Application Publication No. 2011/0248312 A1 discloses a silicone resin sheet obtained by semi-curing a composition for a silicone resin, comprising: an organopolysiloxane having at least two alkenylsilyl groups in a molecule; an organopolysiloxane having at least two hydrosilyl groups in a molecule; a hydrosilylation catalyst; and a curing retardant. However, their hotmelt performance was insufficient to apply to practical applications.

It is an object of the present invention to provide a reactive silicone composition capable of forming a hotmelt material. And it is another object of the present invention to provide a hotmelt material. Furthermore, it is another object of the present invention to provide a curable hotmelt composition.

DISCLOSURE OF INVENTION

The reactive silicone composition of the present invention for forming a hotmelt material, comprises:

(A) an organopolysiloxane resin represented by the following average unit formula:

$$(R^1_3SiO_{1/2})_a(R^1_2SiO_{2/2})_b(R^1SiO_{3/2})_c(SiO_{4/2})_d(R^2O_{1/2})_e$$

wherein each $R^1$ independently is a monovalent hydrocarbon group having 1 to 10 carbon atoms, with the proviso that 4 to 12 mol % of all $R^1$ in a molecule are alkenyl groups; $R^2$ is a hydrogen atom or an alkyl group having 1 to 10 carbon atoms; and a, b, c, d, and e are numbers that satisfy: $0.35 \leq a \leq 0.60$; $0 \leq b \leq 0.1$; $0 \leq c \leq 0.1$; $0.40 \leq d \leq 0.65$; $0 \leq e \leq 0.05$; and $a+b+c+d=1$, in an amount of 15 to 50% by mass of total amount of components (A) to (C);

(B) an organopolysiloxane resin represented by the following average unit formula:

$$(R^3_3SiO_{1/2})_f(R^3_2SiO_{2/2})_g(R^3SiO_{3/2})_h(SiO_4)_i(R^4O_{1/2})_j$$

wherein each $R^3$ independently is a monovalent hydrocarbon group having 1 to 10 carbon atoms except for an alkenyl group; $R^4$ is a hydrogen atom or an alkyl group having 1 to 10 carbon atoms; and f, g, h, i, and j are numbers that satisfy: $0.35 \leq f \leq 0.55$; $0 \leq g \leq 0.2$; $0 \leq h \leq 0.2$; $0.45 \leq i \leq 0.65$; $0 \leq j \leq 0.05$; and $f+g+h+i=1$, in an amount of 20 to 45% by mass of total amount of components (A) to (C);

(C) a diorganopolysiloxane represented by the following average formula:

$$R^5_3SiO(SiR^5_2O)_kSiR^5_3$$

wherein each $R^5$ independently is a monovalent hydrocarbon group having 1 to 10 carbon atoms, with the proviso that at least two $R^5$ in a molecule are alkenyl groups; and k is a number of 20 to 5,000, in an amount of 10 to 40% by mass of total amount of components (A) to (C);

(D) an organohydrogenpolysiloxane having two silicon-bonded hydrogen atoms in a molecule, in an amount that component (D) gives 0.1 to 0.6 silicon-bonded hydrogen atoms per one alkenyl group in components (A) and (C);

(E) an organohydrogenpolysiloxane having at least three silicon-bonded hydrogen atoms in a molecule, in an amount that component (E) gives 0.1 to 0.5 silicon-bonded hydrogen atoms per one alkenyl group in components (A) and (C); and (F) a hydrosilylation catalyst in a sufficient amount to conduct a hydrosilylation of the composition.

The reactive silicone composition preferably comprises (G) a phosphor, in an amount of 10 to 400 parts by mass per 100 parts by mass of the sum of components (A) to (F).

A hotmelt material of the present invention is obtained by conducting a hydrosilylation reaction of the above composition.

A curable hotmelt composition of the present invention comprises: the above hotmelt material, and (H) an organohydrogenpolysiloxane having at least two silicon-bonded hydrogen atoms in a molecule, in an amount that component (H) gives 0.1 to 0.8 silicon-bonded hydrogen atoms per one alkenyl group in components (A) and (C) in the above composition.

EFFECTS OF INVENTION

The reactive silicone composition of the present invention can be reacted to form a hotmelt material. The hotmelt material of the present invention can have excellent shelf life stability, instant adhesion performance by hotmelt process, and adherent performance with other addition curable silicones. The curable hot melt composition of the present invention can have excellent instant and permanent adhesion performance.

DETAILED DESCRIPTION OF THE INVENTION

Let us first consider the reactive silicone composition of the present invention.

Component (A) is an organopolysiloxane resin represented by the following average unit formula:

$$(R^1{}_3SiO_{1/2})_a(R^1{}_2SiO_{2/2})_b(R^1SiO_{3/2})_c(SiO_{4/2})_d(R^2O_{1/2})_e$$

In the formula, each $R^1$ independently is a monovalent hydrocarbon group having 1 to 10 carbon atoms, such as methyl, ethyl, propyl, butyl, pentyl, hexyl, heptyl, or similar alkyl groups; vinyl, allyl, butenyl, pentenyl, hexenyl, or similar alkenyl groups; phenyl, tolyl, xylyl, or similar aryl groups; benzyl, phenethyl, or similar aralkyl groups; and chloromethyl, 3-chloropropyl, 3,3,3-trifluoropropyl, or similar halogenated alkyl groups. In addition, 4 to 12 mol % of all $R^1$ in a molecule are alkenyl groups, preferably 5 to 10 mol % of all $R^1$ in a molecule are alkenyl groups. If the content of alkenyl groups exceeds the recommended lower limit of the range, it is possible to obtain the tackfree hotmelt material at room temperature. If, on the other hand, the content of alkenyl groups is below the recommended upper limit of the range, it is possible to obtain the hotmelt material having good hotmelt performance.

In the formula, $R^2$ is a hydrogen atom or an alkyl group having 1 to 10 carbon atoms. The alkyl group for $R^2$ is exemplified by methyl, ethyl, propyl, butyl, pentyl, or hexyl.

In the formula, a is a number that shows the proportion of siloxane units of the general formula: $R^1{}_3SiO_{1/2}$. This number satisfies: $0.35 \leq a \leq 0.60$, preferably $0.40 \leq a \leq 0.55$. If a exceeds the recommended lower limit of the range, it is possible to obtain the hotmelt material having good hotmelt performance. If, on the other hand, a is below the recommended upper limit of the range, it is possible to obtain the tackfree hotmelt material at room temperature. In the above formula, b is a number that shows the proportion of siloxane units of the general formula: $R^1{}_2SiO_{2/2}$. This number satisfies: $0 \leq b \leq 0.1$, preferably $0 \leq b \leq 0.05$. If b is below the upper limit of the range, it is possible to obtain the hotmelt material having good hotmelt performance and the hot tackfree hotmelt materials at room temperature. In the above formula, c is a number that shows the proportion of siloxane units of general formula: $R^1SiO_{3/2}$. This number satisfies: $0 \leq c \leq 0.1$, preferably $0 \leq c \leq 0.05$. If c is below the upper limit of the range, it is possible to obtain the hotmelt material having good hotmelt performance and the hot tackfree hotmelt materials at room temperature. In the above formula, d is a number that shows the proportion of siloxane units of general formula: $SiO_{4/2}$. This number satisfies: $0.40 \leq d \leq 0.65$, preferably $0.45 \leq d \leq 0.60$. If d exceeds the recommended lower limit of the range, it is possible to obtain the tackfree hotmelt material at room temperature. If, on the other hand, d is below the upper limit of the range, it is possible to obtain the hotmelt material having good hotmelt performance. In the above formula, e is a number that shows the proportion of units of general formula: $R^2O_{1/2}$. This number satisfies: $0 \leq e \leq 0.05$, preferably $0 \leq e \leq 0.03$. If e is below the upper limit of the range, it is possible to obtain the hotmelt material having good hotmelt performance and the hot tackfree hotmelt materials at room temperature. Finally, the sum of a, b, c, and d is equal to 1.

The amount of component (A) is 15 to 50% by mass, preferably 20 to 45% by mass of total amount of components (A) to (C). If the amount of component (A) exceeds the recommended lower limit of the range, it is possible to reduce the surface tackiness at room temperature of the obtained hot melt material. If, on the other hand, the amount of component (A) is below the recommended upper limit of the range, it is possible to increase the mechanical strength of the hot melt material.

Component (B) is an organopolysiloxane resin represented by the following average unit formula:

$$(R^3{}_3SiO_{1/2})_f(R^3{}_2SiO_{2/2})_g(R^3SiO_{3/2})_h(SiO_{4/2})_i(R^4O_{1/2})_j$$

In the formula, each $R^3$ independently is a monovalent hydrocarbon group having 1 to 10 carbon atoms except for alkenyl groups, such as methyl, ethyl, propyl, butyl, pentyl, hexyl, heptyl, or similar alkyl groups; phenyl, tolyl, xylyl, or similar aryl groups; benzyl, phenethyl, or similar aralkyl groups; and chloromethyl, 3-chloropropyl, 3,3,3-trifluoropropyl, or similar halogenated alkyl groups.

In the formula, $R^4$ is a hydrogen atom or an alkyl group having 1 to 10 carbon atoms. The alkyl group for $R^4$ is exemplified by methyl, ethyl, propyl, butyl, pentyl, or hexyl.

In the formula, f is a number that shows the proportion of siloxane units of the general formula: $R^3{}_3SiO_{1/2}$. This number satisfies: $0.35 \leq f \leq 0.55$, preferably $0.40 \leq f \leq 0.50$. If f exceeds the recommended lower limit of the range, it is possible to obtain the tackfree hotmelt material at room temperature. If, on the other hand, f is below the recommended upper limit of the range, it is possible to obtain the hotmelt material having good hotmelt performance. In the above formula, g is a number that shows the proportion of siloxane units of the general formula: $R^3{}_2SiO_{2/2}$. This number satisfies: $0 \leq g \leq 0.2$, preferably $0 \leq g \leq 0.1$. If g is below the upper limit of the range, it is possible to obtain the hotmelt material having good hotmelt performance and the hot tackfree hotmelt materials at room temperature. In the above formula, h is a number that shows the proportion of siloxane units of general formula: $R^3SiO_{3/2}$. This number satisfies: $0 \leq h \leq 0.2$, preferably $0 \leq h \leq 0.1$. If h is below the upper limit of the range, it is possible to obtain the hotmelt material having good hotmelt performance and the hot tackfree hotmelt materials at room temperature. In the above formula, i is a number that shows the proportion of siloxane units of general formula: $SiO_{4/2}$. This number satisfies: $0.45 \leq i \leq 0.65$, preferably $0.50 \leq i \leq 0.60$. If i exceeds the recommended lower limit of the range, it is possible to obtain the hotmelt material having good hotmelt performance. If, on the other hand, i is below the upper limit of the range, it is possible to obtain the tackfree hotmelt material at room temperature. In the above formula, j is a number that shows the proportion of units of general formula: $R^4O_{1/2}$. This number satisfies: $0 \leq j \leq 0.05$, preferably $0 \leq j \leq 0.03$. If j is below the upper limit of the range, it is possible to obtain the hotmelt material having good hotmelt performance and the hot tackfree hotmelt materials at room temperature. Finally, the sum of f, g, h, and i is equal to 1.

The amount of component (B) is 15 to 50% by mass, preferably 20 to 45% by mass of total amount of components (A) to (C). If the amount of component (B) exceeds the recommended lower limit of the range, it is possible to reduce the surface tackiness at room temperature of the obtained hot melt material. If, on the other hand, the amount of component (B) is below the recommended upper limit of the range, it is possible to increase the adhesion of the hot melt material.

Component (C) is a diorganopolysiloxane represented by the following average formula:

$$R^5_3SiO(SiR^5_2O)_kSiR^5_3$$

In the formula, each $R^5$ independently is a monovalent hydrocarbon group having 1 to 10 carbon atoms, such as methyl, ethyl, propyl, butyl, pentyl, hexyl, heptyl, or similar alkyl groups; vinyl, allyl, butenyl, pentenyl, hexenyl, or similar alkenyl groups; phenyl, tolyl, xylyl, or similar aryl groups; benzyl, phenethyl, or similar aralkyl groups; and chloromethyl, 3-chloropropyl, 3,3,3-trifluoropropyl, or similar halogenated alkyl groups. In addition, at least two $R^5$ in a molecule are alkenyl groups, preferably vinyl groups.

In the formula, k is a number of 20 to 5,000, preferably 30 to 3,000. If k exceeds the recommended lower limit of the range, it is possible to obtain the tackfree hotmelt material at room temperature. If, on the other hand, k is below the recommended upper limit of the range, it is possible to obtain the hotmelt material having good hotmelt performance.

The amount of component (C) is 10 to 40% by mass, preferably 15 to 30% by mass of total amount of components (A) to (C). If the amount of component (C) exceeds the recommended lower limit of the range, it is possible to increase the mechanical strength of the obtained hotmelt material. If, on the other hand, the amount of component (C) is below the recommended upper limit of the range, it is possible to reduce the surface tackiness at room temperature of the obtained hotmelt material.

Component (D) is an organohydrogenpolysiloxane having two silicon-bonded hydrogen atoms in a molecule, which serves as a crosslinking agent for making a loose network structure by inducing a hydrosilylation reaction with alkenyl groups in component (A) and (C).

The silicon-bonded groups of component (D) are exemplified by monovalent hydrocarbon groups which are free of unsaturated aliphatic bonds. Specific examples are methyl, ethyl, propyl, butyl, pentyl, hexyl, heptyl, or similar alkyl groups; phenyl, tolyl, xylyl, or similar aryl groups; benzyl, phenethyl, or similar aralkyl groups; and 3-chloropropyl, 3,3,3-trifluoropropyl, or similar halogenated alkyl groups.

Component (D) preferably is a linear-chain diorganopolysiloxane capped at both molecular terminals with diorganohydrogensiloxy groups, such as an organohydrogenpolysiloxane represented by the following general formula:

$$HR^6_2SiO(R^6_2SiO)_xSiR^6_2H$$

In the formula, each $R^6$ independently is a monovalent hydrocarbon group having 1 to 10 carbon atoms which are free of unsaturated aliphatic bonds, such as methyl, ethyl, propyl, butyl, pentyl, hexyl, heptyl, or similar alkyl groups; phenyl, tolyl, xylyl, or similar aryl groups; benzyl, phenethyl, or similar aralkyl groups; and chloromethyl, 3-chloropropyl, 3,3,3-trifluoropropyl, or similar halogenated alkyl groups. In the formula, x is a number of 0 to 50.

The amount of component (D) in the composition is an amount that provides 0.1 to 0.6, and preferably 0.2 to 0.5 silicon-bonded hydrogen atoms per one alkenyl group in components (A) and (C). If the amount of component (D) exceeds the recommended lower limit of the range, it is possible to increase the adhesion of the obtained hotmelt material. If, on the other hand, the amount of component (D) is below the recommended upper limit of the range, it is possible to increase the mechanical strength of the obtained hotmelt material.

Component (E) is an organohydrogenpolysiloxane having at least three silicon-bonded hydrogen atoms in a molecule for making a rigid network structure by inducing a hydrosilylation reaction with alkenyl groups in component (A) and (C).

The silicon-bonded groups of component (E) are exemplified by monovalent hydrocarbon groups which are free of unsaturated aliphatic bonds. Specific examples are methyl, ethyl, propyl, butyl, pentyl, hexyl, heptyl, or similar alkyl groups; phenyl, tolyl, xylyl, or similar aryl groups; benzyl, phenethyl, or similar aralkyl groups; and 3-chloropropyl, 3,3,3-trifluoropropyl, or similar halogenated alkyl groups.

Component (E) preferably is a linear-chain diorganopolysiloxane represented by the following general formula:

$$R^7_3SiO(R^7_2SiO)_y(R^7HSiO)_zSiR^7_3$$

In the formula, each $R^7$ independently is a monovalent hydrocarbon group having 1 to 10 carbon atoms which are free of unsaturated aliphatic bonds, such as methyl, ethyl, propyl, butyl, pentyl, hexyl, heptyl, or similar alkyl groups; phenyl, tolyl, xylyl, or similar aryl groups; benzyl, phenethyl, or similar aralkyl groups; and chloromethyl, 3-chloropropyl, 3,3,3-trifluoropropyl, or similar halogenated alkyl groups. In the formula, y is a number of 0 to 100, and z is a number of 3 to 100.

The amount of component (E) in the composition is an amount that provides 0.1 to 0.5, and preferably 0.1 to 0.4 silicon-bonded hydrogen atoms per one alkenyl group in components (A) and (C). If the amount of component (E) exceeds the recommended lower limit of the range, it is possible to obtain the tackfree hotmelt materials at room temperature. If, on the other hand, the amount of component (E) is below the recommended upper limit of the range, it is possible to obtain the hotmelt materials having good hotmelt performance.

Component (F) is a hydrosilylation catalyst, which is used for accelerating the hydrosilylation between silicon-bonded hydrogen atoms of components (D) and (E), and alkenyl groups contained in components (A) and (C). Component (F) may comprise a platinum-based catalyst, rhodium-based catalyst, or a palladium-based catalyst. The platinum-based catalyst is preferable since it significantly accelerates curing of the composition. The platinum-based catalyst can be exemplified by a platinum-alkenylsiloxane complex, a platinum-olefin complex, or a platinum-carbonyl complex, of which the platinum-alkenylsiloxane complex is preferable. Such an alkenylsiloxane can be exemplified by the 1,3-divinyl-1,1,3,3-tetramethyl disilosane; 1,3,5,7-tetramethyl-1,3,5,7-tetravinyl cyclotetrasiloxane; substituted alkenylsiloxane which are the aforementioned alkenylsiloxanes having a part of the methyl groups substituted with ethyl, phenyl groups; or substituted alkenylsiloxane which are the aforementioned alkenylsiloxanes having a part of the vinyl groups substituted with aryl, hexenyl, or similar groups. From the viewpoint of better stability of the platinum-alkenylsiloxane complexes, the use of the 1,3-divinyl-1,1,3,3-tetramethyl disilosane is preferable.

For further improvement of stability, the aforementioned alkenylsiloxane complexes can be combined with 1,3-divinyl-1,1,3,3-tetramethyl disiloxane, 1,3-diallyl-1,1,3,3-tetramethyl disiloxane, 1,3-divinyl-1,1,3,3-tetraphenyl disiloxane, 1,3,5,7-tetramethyl-1,3,5,7-tetravinyl cyclotetrasiloxane, or similar alkenylsiloxanes, dimethylsiloxane oligomers, or other organosiloxane oligomers. Most preferable are alkenylsiloxanes.

Component (F) is added in an amount sufficient for curing the composition. More specifically, in terms of mass units, this component is added in an amount of 0.01 to 500 ppm, preferably 0.01 to 100 ppm, and most preferably, 0.01 to 50 ppm of the metal atoms of this component per mass of the composition. If the amount of component (F) exceeds the recommended lower limit of the range, the composition can be reacted to a sufficient degree. If, on the other hand, the amount of component (F) is below the recommended upper limit of the range, it is possible to prevent coloring of a cured product of the composition.

If necessary, the reactive composition may incorporate arbitrary components, such as (G) a phosphor, which is comprised for wavelength conversion of the hotmelt material produced by the composition according to the present invention. Component (G) is not particularly limited and may include any known in the art. In one embodiment, the phosphor is made from a host material and an activator, such as copper-activated zinc sulfide and silver-activated zinc sulfide. Suitable but non-limiting host materials include oxides, nitrides and oxynitrides, sulfides, selenides, halides or silicates of zinc, cadmium, manganese, aluminum, silicon, or various rare earth metals. Additional suitable phosphors include, but are not limited to, $Zn_2SiO_4$:Mn (Willemite); ZnS:Ag+(Zn,Cd)S:Ag; ZnS:Ag+ZnS:Cu+$Y_2O_2$S:Eu; ZnO:Zn; KCl; ZnS:Ag,Cl or ZnS:Zn; (KF,$MgF_2$):Mn; (Zn,Cd)S:Ag or (Zn,Cd)S:Cu; $Y_2O_2$S:Eu+$Fe_2O_3$, ZnS:Cu, Al; ZnS:Ag+Co-on-$Al_2O_3$; (KF,$MgF_2$):Mn; (Zn,Cd)S:Cu, Cl; ZnS:Cu or ZnS:Cu,Ag; $MgF_2$:Mn; (Zn,Mg)$F_2$:Mn; $Zn_2SiO_4$:Mn,As; ZnS:Ag+(Zn,Cd)S:Cu; $Gd_2O_2$S:Tb; $Y_2O_2$S:Tb; $Y_3Al_5O_{12}$:Ce; $Y_2SiO_5$:Ce; $Y_3Al_5O_{12}$:T; ZnS: Ag,Al; ZnS:Ag; ZnS:Cu,Al or ZnS:Cu,Au,Al; (Zn,Cd)S:Cu, Cl+(Zn,Cd)S:Ag,Cl; $Y_2SiO_5$:Tb; $Y_2O_5$:Tb; $Y_3(Al,Ga)_5O_{12}$:Ce; $Y_3(Al,Ga)_5O_{12}$:Tb; $InBO_3$:Tb; $InBO_3$:Eu; $InBO_3$:Tb+$InBO_3$:Eu; $InBO_3$:Tb+$InBO_3$:Eu+ZnS:Ag; (Ba,Eu)$Mg_2Al_{16}O_{27}$; (Ce,Tb)$MgAl_{11}O_{19}$; $BaMgA_{10}O_{17}$:Eu,Mn; $BaMg_2Al_{16}O_{27}$:Eu(II); $BaMgAl_{10}O_{17}$:Eu,Mn; $BaMg_2Al_{16}O_{27}$:Eu(II),Mn(II); $Ce_{0.67}Tb_{0.33}MgAl_{11}O_{19}$:Ce, Tb; $Zn_2SiO_4$:Mn,$Sb_2O_3$; $CaSiO_3$:Pb,Mn; $CaWO_4$ (Scheelite); $CaWO_4$:Pb; $MgWO_4$; (Sr,Eu,Ba,Ca)$_5(PO_4)_3$Cl; $Sr_5Cl(PO_4)_3$:Eu(II); (Ca,Sr,Ba)$_3(PO_4)_2Cl_2$:Eu; (Sr,Ca,Ba)$_{10}$(PO$_4)_6$ $Cl_2$:Eu; $Sr_2P_2O_7$:Sn(II); $Sr_6PsBO_{20}$:Eu; $Ca_5F(PO_4)_3$:Sb; (Ba,Ti)$_2P_2O_7$:Ti; $3Sr_3(PO_4)_2$.$SrF_2$:Sb,Mn; SrsF$(PO_4)_3$:Sb,Mn; $SrsF(PO_4)_3$:Sb,Mn; $LaPO_4$:Ce,T; (La,Ce,Tb)$PO_4$; (La,Ce,Tb)$PO_4$:Ce,Th; $Ca_3(PO_4)_2$.$CaF_2$:Ce,Mn; (Ca,Zn,Mg)$_3(PO_4)_2$:Sn; (Zn,Sr)$_3(PO_4)_2$:Mn; (Sr,Mg)$_3$(PO$_4)_2$:Sn; (Sr,Mg)$_3(PO_4)_2$:Sn(II); $Ca_5F(PO_4)_3$:Sb,Mn; $Ca_5$(F,Cl)(PO$_4)_3$:Sb,Mn; (Y,Eu)$_2O_3$; $Y_2O_3$:Eu(III); $Mg_4$(F)$GeO_6$:Mn; $Mg_4$(F)(Ge,Sn)$O_6$:Mn; Y(P,V)$O_4$:Eu; $YVO_4$:Eu; $Y_2O_2$S:Eu; 3.5 MgO.0.5 $MgF_2$.$GeO_2$:Mn; $Mg_5As_2O_{11}$:Mn; $SrAl_2O_7$:Pb; $LaMgAl_{11}O_{19}$:Ce; $LaPO_4$:Ce; $SrAl_{12}O_{19}$:Ce; $BaSi_2O_5$:Pb; $SrFB_2O_3$:Eu(II); $SrB_4O_7$:Eu; $Sr_2MgSi_2O_7$:Pb; $MgGa_2O_4$:Mn(II); $Gd_2O_2$S:Tb; $Gd_2O_2$S:Eu; $Gd_2O_2$S:Pr; $Gd_2O_2$S:Pr,Ce,F; $Y_2O_2$S:Tb; $Y_2O_2$S:Eu; $Y_2O_2$S:Pr; Zn(0.5)Cd(0.4)S:Ag; Zn(0.4)Cd(0.6)S:Ag; $CdWO_4$; $CaWO_4$; $MgWO_4$; $Y_2SiO_5$:Ce; $YAlO_3$:Ce; $Y_3Al_5O_{12}$:Ce; $Y_3(Al,Ga)_5O_{12}$:Ce; CdS:In; ZnO:Ga; ZnO:Zn; (Zn,Cd)S:Cu,Al; ZnS:Cu,Al,Au; ZnCdS:Ag,Cu; ZnS:Ag; anthracene, EJ-212, $Zn_2SiO_4$:Mn; ZnS:Cu; NaI:Tl; CsI:Tl; LiF/ZnS:Ag; LiF/ZnSCu,Al,Au, and combinations thereof.

There are no special restrictions with regard to the amount in which component (G) can be added to the composition, but it is preferable to add this component in an amount of 10 to 400 parts by mass per 100 parts by mass of the sum of components (A) to (F). If the amount of component (G) exceeds the recommended lower limit of the range, it is possible to obtain the wavelength conversion effect of the film. If, on the other hand, the amount of component (G) is below the recommended upper limit of the range, it is possible to increase the adhesion of the obtained hotmelt material.

If necessary, the composition may incorporate arbitrary components, such as 2-methyl-3-butyn-2-ol, 3,5-dimethyl-1-hexyn-3-ol, 2-phenyl-3-butyn-2-ol, or similar alkyn alcohols; 3-methyl-3-penten-1-yne, 3,5-dimethyl-3-hexen-1-yne, or a similar enyne-based compound; 1,3,5,7-tetramethyl-1,3,5,7-tetravinyl cyclotetrasiloxane, 1,3,5,7-tetramethyl-1,3,5,7-tetrahexenyl cyclotetrasiloxane, benzotriazole or similar reaction inhibitors. Although there are no special restrictions with regard to the amounts in which the aforementioned reaction inhibitors can be used, it is recommended to add the reaction inhibitors in an amount of 0.0001 to 5 parts by mass per 100 parts by mass of the sum of components (A) to (F).

If necessary, an adhesion-imparting agent can be added to the composition of the invention for improving its adhesive properties. Such an agent may comprise an organic silicon compound which is different from aforementioned components (A) to (E) and which contains at least one silicon-bonded alkoxy group in a molecule. This alkoxy group can be represented by a methoxy, ethoxy, propoxy, and a butoxy group. A methoxy group is the most preferable. Groups other than the aforementioned silicon-bonded alkoxy groups of the organic silicon compound also can be used. Examples of such other groups are the following: substituted or unsubstituted monovalent hydrocarbon groups such as the aforementioned alkyl groups, alkenyl groups, aryl groups, aralkyl groups; 3-glycidoxypropyl groups, 4-glycidoxybutyl groups, or similar glycidoxyalkyl groups; 2-(3,4-epoxycyclohexyl) ethyl groups, 3-(3,4-epoxycyclohexyl) propyl groups, or similar epoxycyclohexyl groups; 4-oxiranylbutyl groups, 8-oxiranyloctyl groups, or similar oxiranylalkyl groups, or other epoxy-containing monovalent organic groups; 3-methacryloxypropyl groups, or similar acryl-containing monovalent organic groups; and hydrogen atoms. At least one of these groups can be contained in one molecule. The most preferable are epoxy-containing and acryl-containing monovalent organic groups. It is recommended that the aforementioned organic silicon compounds contain groups to react with components (A) and (C), or (D) and (E), in particular such groups as silicon-bonded alkenyl groups and silicon-bonded hydrogen atoms. For better adhesion to various materials, it is preferable to use the aforementioned organic silicon compounds that have at least one epoxy-containing monovalent group per molecule. Examples of such compounds are organosilane compounds and organosiloxane oligomers. The aforementioned organosilane oligomers may have a straight-chain, partially-branched straight-chain, branched-chain, cyclic, and net-like molecular structure. The straight-chain, branched-chain, and net-like structures are preferable. The following are examples of the aforementioned organic silicon compounds: 3-glycidoxypropyltrimethoxysilane, 2-(3,4-epoxycyclohexyl) ethyltrimethoxysilane, 3-methacryloxypropyltrimethoxysilane, or similar silane compounds; a siloxane compound having in one molecule at least one silicon-bonded alkenyl group, at least one silicon-bonded hydrogen atom, or at least one silicon-bonded alkoxy group; a silane compound having in a molecule at least one silicon-bonded alkoxy group; a mixture of a silane or a siloxane compound having in a molecule at least one silicon-bonded alkoxy group with a siloxane compound having in a molecule at least one silicon-bonded hydroxyl group and at least one silicon-bonded alkenyl group; a siloxane compound represented by the following formula:

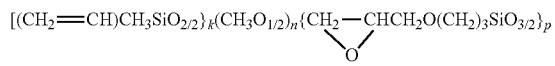

wherein k, m, and p are positive numbers; and a siloxane compound represented by the following formula:

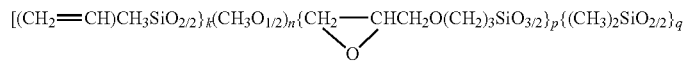

wherein k, m, p, and q are positive numbers. There are no special restrictions with regard to the content of the adhesion-imparting agent in the composition, it is recommended to use it in the amount of 0.01 to 10 parts by mass for each 100 parts by mass of the sum of components (A) to (F).

If necessary, a solvent can be added to the composition of the invention to reduce the viscosity of composition for processability improvement. Although such a solvent may comprise any kind of solvents, the solvents are preferably hydrocarbons and esters.

Within the limits not contradictory to the object of the invention, the aforementioned arbitrary components may also include silica, glass, alumina, zinc oxide, or other inorganic fillers; a powdered polymethacrylate resin, or other fine organic resin powders; as well as heat-resistance agents, dyes, pigments, flame retardants, solvents, etc.

The composition of the invention is reacted at room temperature or by heating. However, for acceleration of the curing process, heating is recommended. The heating temperature is in the range of 50 to 200° C.

The hotmelt material of the present invention will now be described in more details.

The hotmelt material of the present invention is obtained by conducting a hydrosilylation reaction of the composition under the above conditions. The obtained hotmelt material does not show any deformation at 25° C. but it shows easy deformation at high temperature like 100° C.

The curable hotmelt composition of the present invention will now be described in more details.

The curable hotmelt in the present invention comprises: the above hotmelt material, and (H) an organohydrogenpolysiloxane having at least two silicon-bonded hydrogen atoms in a molecule.

Component (H) serves as a crosslinking agent to cure the hotmelt composition by inducing a hydrosilylation reaction with the residual alkenyl groups in the above hotmelt material.

The silicon-bonded groups of component (H) are exemplified by monovalent hydrocarbon groups which are free of unsaturated aliphatic bonds. Specific examples are methyl, ethyl, propyl, butyl, pentyl, hexyl, heptyl, or similar alkyl groups; phenyl, tolyl, xylyl, or similar aryl groups; benzyl, phenethyl, or similar aralkyl groups; and 3-chloropropyl, 3,3,3-trifluoropropyl, or similar halogenated alkyl groups.

Component (H) preferably is a linear-chain diorganopolysiloxane represented by the following general formula:

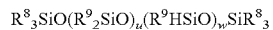

In the formula, each $R^8$ independently is a hydrogen atom or a monovalent hydrocarbon group having 1 to 10 carbon atoms which are free of unsaturated aliphatic bonds. Hydrocarbon group for $R^8$ is exemplified by methyl, ethyl, propyl, butyl, pentyl, hexyl, heptyl, or similar alkyl groups; phenyl, tolyl, xylyl, or similar aryl groups; benzyl, phenethyl, or similar aralkyl groups; and chloromethyl, 3-chloropropyl, 3,3,3-trifluoropropyl, or similar halogenated alkyl groups.

In the formula, each $R^9$ independently is a monovalent hydrocarbon group having 1 to 10 carbon atoms which are free of unsaturated aliphatic bonds, such as methyl, ethyl, propyl, butyl, pentyl, hexyl, heptyl, or similar alkyl groups; phenyl, tolyl, xylyl, or similar aryl groups; benzyl, phenethyl, or similar aralkyl groups; and chloromethyl, 3-chloropropyl, 3,3,3-trifluoropropyl, or similar halogenated alkyl groups.

In the formula, u is a number of 0 to 100, and w is a number of 0 to 100. If w is 0, at least two $R^8$ are hydrogen atoms.

The amount of component (H) in the composition is an amount that provides 0.1 to 0.8, and preferably 0.2 to 0.7 silicon-bonded hydrogen atoms per one alkenyl group in components (A) and (C) in the above reactive silicone composition. If the amount of component (H) exceeds the recommended lower limit of the range, it is possible to increase the adhesion of the obtained cured materials. If, on the other hand, the amount of component (H) is below the recommended upper limit of the range, it is possible to increase the mechanical strength of the obtained cured material.

If necessary, the arbitrary components mentioned in the reactive silicone composition can be added to the curable hotmelt composition of the invention.

EXAMPLES

The reactive silicone composition, hotmelt material, and curable hotmelt composition of the present invention will be further described in more detail with reference to Practical and Comparative Examples. In the formulae, Me, Vi, and Ep corresponds to methyl groups, vinyl groups, and 3-glycidoxypropyl groups, respectively.

Practical Example 1

A reactive silicone composition was prepared by mixing: 32.5 parts by mass of an organopolysiloxane resin represented by the following average unit formula:

32.5 parts by mass of an organopolysiloxane resin represented by the following average unit formula:

28.0 parts by mass of a diorganopolysiloxane represented by the following average formula:

Me$_3$SiO(Me$_2$SiO)$_{789}$(MeViSiO)$_{11}$SiMe$_3$ 5.0 parts by mass of an organohydrogenpolysiloxane represented by the following average formula:

HMe$_2$SiO(Me$_2$SiO)$_{17}$SiMe$_2$H 2.0 parts by mass of an organohydrogenpolysiloxane represented by the following average formula:

Me$_3$SiO(MeHSiO)$_7$(Me$_2$SiO)$_{6.5}$SiMe$_3$ 0.01 parts by mass of platinum-1,1,3,3-tetramethyl-1,3-divinyldisiloxane complex in excess the disiloxane (platinum content is 4.5% by mass), 0.05 parts by mass of 1-ethynylcyclohexan-1-ol, and 0.5 parts by mass of epoxy-functional organopolysiloxane resin represented by the following average unit formula:

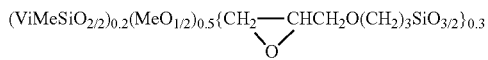

(ViMeSiO$_{2/2}$)$_{0.2}$(MeO$_{1/2}$)$_{0.5}$\{CH$_2$—CHCH$_2$O(CH$_2$)$_3$SiO$_{3/2}$\}$_{0.3}$
        \O/

85 parts by mass of the obtained composition were added 15 parts by mass of mesitylene as a solvent, and the mixture was coated in 100 μm in thickness on a PET film followed by heating at 120° C. for 30 minutes. The film supported on the PET film was tackfree at 25° C. and peeled off from the PET film to afford the free-standing film. The film placed on an aluminum plate was molten at 100° C. and was re-sticked to the aluminum plate.

Practical Example 2

A reactive silicone composition was prepared by mixing: 32.5 parts by mass of an organopolysiloxane resin represented by the following average unit formula:

(ViMeSiO$_{1/2}$)$_{0.11}$(Me$_3$SiO$_{1/2}$)$_{0.33}$(SiO$_{4/2}$)$_{0.56}$(HO$_{1/2}$)$_{0.02}$ 32.5 parts by mass of an organopolysiloxane resin having represented by the following average unit formula:

(Me$_3$SiO$_{1/2}$)$_{0.44}$(SiO$_{4/2}$)$_{0.56}$(HO$_{1/2}$)$_{0.02}$ 28.0 parts by mass of a diorganopolysiloxane represented by the following average formula:

Me$_3$SiO(Me$_2$SiO)$_{789}$(MeViSiO)$_{11}$SiMe$_3$ 18.0 parts by mass of an organohydrogenpolysiloxane represented by the following average formula:

HMe$_2$SiO(Me$_2$SiO)$_{17}$SiMe$_2$H 0.5 parts by mass of an organohydrogenpolysiloxane represented by the following average formula:

Me$_3$SiO(MeHSiO)$_7$(Me$_2$SiO)$_{6.5}$SiMe$_3$ 0.01 parts by mass of platinum-1,1,3,3-tetramethyl-1,3-divinyldisiloxane complex in excess the disiloxane (platinum content is 4.5% by mass), 0.05 parts by mass of 1-ethynylcyclohexan-1-ol, and 0.5 parts by mass of epoxy-functional organopolysiloxane resin represented by the following average unit formula:

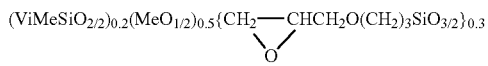

(ViMeSiO$_{2/2}$)$_{0.2}$(MeO$_{1/2}$)$_{0.5}$\{CH$_2$—CHCH$_2$O(CH$_2$)$_3$SiO$_{3/2}$\}$_{0.3}$
        \O/

85 parts by mass of the obtained composition were added 15 parts by mass of mesitylene as a solvent, and the mixture was coated in 100 μm in thickness on a PET film followed by heating at 120° C. for 30 minutes. The film supported on the PET film was tackfree at 25° C. and peeled off from the PET film to afford the free-standing film. The film placed on an aluminum plate was molten at 100° C. and was re-sticked to the aluminum plate.

Practical Example 3

A reactive silicone composition was prepared by mixing: 37.4 parts by mass of an organopolysiloxane resin represented by the following average unit formula:

(ViMe$_2$SiO$_{1/2}$)$_{0.08}$(Me$_3$SiO$_{1/2}$)$_{0.42}$(SiO$_{4/2}$)$_{0.50}$(HO$_{1/2}$)$_{0.01}$ 37.4 parts by mass of an organopolysiloxane resin represented by the following average unit formula:

(Me$_3$SiO$_{1/2}$)$_{0.44}$(SiO$_{4/2}$)$_{0.56}$(HO$_{1/2}$)$_{0.02}$ 15.3 parts by mass of a diorganopolysiloxane represented by the following average formula:

ViMe$_2$SiO(Me$_2$SiO)$_{800}$SiMe$_2$Vi 5.1 parts by mass of a diorganopolysiloxane represented by the following average formula:

ViMe$_2$SiO(Me$_2$SiO)$_{45}$SiMe$_2$Vi 4.0 parts by mass of an organohydrogenpolysiloxane represented by the following average formula:

HMe$_2$SiO(Me$_2$SiO)$_{17}$SiMe$_2$H 0.8 parts by mass of an organohydrogenpolysiloxane represented by the following average formula:

Me$_3$SiO(MeHSiO)$_{55}$SiMe$_3$ 0.01 parts by mass of platinum-1,1,3,3-tetramethyl-1,3-divinyldisiloxane complex in excess the disiloxane (platinum content is 4.5% by mass), and 0.1 parts by mass of 1-ethynylcyclohexan-1-ol.

30 parts by mass of the obtained composition were added 70 parts by mass of a YAG phosphor (Intematix NYAG4454) and 20 parts by mass of mesitylene, and the mixture was mixed until the uniform mixture was obtained. The solution was coated in 100 μm in thickness on a PET film followed by heating at 120° C. for 30 minutes. The film supported on the PET film was tackfree solid and was cut off to smaller piece by knife without any cracking and deformation. The obtained film piece was picked up from the PET film and placed onto a silicon wafer followed by heating at 150° C. for 30 min. The cross-cut test result showed that 100% of attached area of the film was adhered well to the surface of silicon wafer.

Practical Example 4

A reactive silicone composition was prepared by mixing: 37.4 parts by mass of an organopolysiloxane resin represented by the following average unit formula:

(ViMe$_2$SiO$_{1/2}$)$_{0.08}$(Me$_3$SiO$_{1/2}$)$_{0.42}$(SiO$_{4/2}$)$_{0.50}$(HO$_{1/2}$)$_{0.01}$ 37.4 parts by mass of an organopolysiloxane resin represented by the following average unit formula:

(Me$_3$SiO$_{1/2}$)$_{0.44}$(SiO$_4$)$_{0.56}$(HO$_{1/2}$)$_{0.02}$ 8.2 parts by mass of a diorganopolysiloxane represented by the following average formula:

ViMe$_2$SiO(Me$_2$SiO)$_{800}$SiMe$_2$Vi 2.8 parts by mass of a diorganopolysiloxane represented by the following average formula:

$ViMe_2SiO(Me_2SiO)_{45}SiMe_2Vi$ 14.0 parts by mass of an organohydrogenpolysiloxane represented by the following average formula:

$HMe_2SiO(Me_2SiO)_{17}SiMe_2H$ 0.2 parts by mass of an organohydrogenpolysiloxane represented by the following average formula:

$Me_3SiO(MeHSiO)_{55}SiMe_3$ 0.01 parts by mass of platinum-1,1,3,3-tetramethyl-1,3-divinyldisiloxane complex in excess the disiloxane (platinum content is 4.5% by mass), and 0.1 parts by mass of 1-ethynylcyclohexan-1-ol.

30 parts by mass of the obtained composition were added 70 parts by mass of a YAG phosphor (Intematix NYAG4454) and 20 parts by mass of mesitylene, and the mixture was mixed until the uniform mixture was obtained. The solution was coated in 100 μm in thickness on a PET film followed by heating at 120° C. for 15 minutes. The film supported on the PET film was tackfree solid and was cut off to smaller piece by knife without any cracking and deformation. The obtained film piece was picked up from the PET film and placed onto a silicon wafer followed by heating at 150° C. for 30 min. The cross-cut test result showed that 100% of attached area of the film was adhered well to the surface of silicon wafer.

Practical Example 5

A curable hotmelt composition was prepared by adding 2.7 parts by mass of an organohydrogenpolysiloxane having at represented by the following average formula:

$Me_3SiO(MeHSiO)_{55}SiMe_3$ to a mixture of 105.1 parts by mass of the hot melt material of Practical Example 1 prepared by reaction of the reactive silicone composition in Practical Example 1 at 100° C. for 2 hours and 27.0 parts by mass of mesitylene.

The mixture was coated in 100 μm in thickness on a PET film followed by heating at 120° C. for 30 minutes. The film supported on the PET film was tackfree at 25° C. and peeled off from the PET film to afford the free-standing film. The film placed on an aluminum plate was molten at 150° C. followed by curing. The resulting film was sticked well to the aluminum plate at 150° C. as well as at room temperature.

Practical Example 6

A curable hotmelt composition was prepared by adding 1.2 parts by mass of an organohydrogenpolysiloxane represented by the following average formula:

$Me_3SiO(MeHSiO)_{55}SiMe_3$ to a mixture of 105.1 parts by mass of the hot melt material of Practical Example 2 prepared by reaction of the reactive silicone composition in Practical Example 2 at 100° C. for 2 hours and 27.0 parts by mass of mesitylene.

The mixture was coated in 100 μm in thickness on a PET film followed by heating at 120° C. for 30 minutes. The film supported on the PET film was tackfree at 25° C. and peeled off from the PET film to afford the free-standing film. The film placed on an aluminum plate was molten at 150° C. followed by curing. The resulting film was sticked well to the aluminum plate at 150° C. as well as at room temperature.

Comparative Example 11

A reactive silicone composition was prepared by mixing: 13.0 parts by mass of an organopolysiloxane resin represented by the following average unit formula:

$(ViMe_2SiO_{1/2})_{0.11}(Me_3SiO_{1/2})_{0.33}(SiO_{4/2})_{0.56}(HO_{1/2})_{0.02}$ 55.0 parts by mass of an organopolysiloxane resin represented by the following average unit formula:

$(Me_3SiO_{1/2})_{0.44}(SiO_{4/2})_{0.56}(HO_{1/2})_{0.02}$ 28.6 parts by mass of a diorganopolysiloxane represented by the following average formula:

$Me_3SiO(Me_2SiO)_{789}(MeViSiO)_{11}SiMe_3$ 2.4 parts by mass of an organohydrogenpolysiloxane represented by the following average formula:

$HMe_2SiO(Me_2SiO)_{17}SiMe_2H$ 1.0 parts by mass of an organohydrogenpolysiloxane represented by the following average formula: $Me_3SiO(MeHSiO)_7(Me_2SiO)_{6.5}SiMe_3$ 0.01 parts by mass of platinum-1,1,3,3-tetramethyl-1,3-divinyldisiloxane complex in excess the disiloxane (platinum content is 4.5% by mass), 0.05 parts by mass of 1-ethynylcyclohexan-1-ol, and 0.5 parts by mass of epoxy-functional organopolysiloxane resin represented by the following average unit formula:

$(ViMeSiO_{2/2})_{0.2}(MeO_{1/2})_{0.5}\{CH_2\text{—}\underset{O}{\underset{\diagdown\diagup}{CHCH_2}}O(CH_2)_3SiO_{3/2}\}_{0.3}$ 85 parts by mass of the obtained composition were added 15 parts by mass of mesitylene as a solvent, and the mixture was coated in 100 μm in thickness on a PET film followed by heating at 120° C. for 30 minutes. The film supported on the PET film was tacky at 25° C. and was difficult to peel off from the PET film.

Comparative Example 2

A reactive silicone composition was prepared by mixing: 54.0 parts by mass of an organopolysiloxane resin represented by the following average unit formula:

$(ViMe_2SiO_{1/2})_{0.11}(Me_3SiO_{1/2})_{0.33}(SiO_{4/2})_{0.56}(HO_{1/2})_{0.02}$ 15.0 parts by mass of an organopolysiloxane resin represented by the following average unit formula:

$(Me_3SiO_{1/2})_{0.44}(SiO_{4/2})_{0.56}(HO_{1/2})_{0.02}$ 2.2 parts by mass of a diorganopolysiloxane represented by the following average formula:

$Me_3SiO(Me_2SiO)_{789}(MeViSiO)_{11}SiMe_3$ 28.0 parts by mass of an organohydrogenpolysiloxane represented by the following average formula:

$HMe_2SiO(Me_2SiO)_{17}SiMe_2H$ 0.8 parts by mass of an organohydrogenpolysiloxane represented by the following average formula:

$Me_3SiO(MeHSiO)_7(Me_2SiO)_{6.5}SiMe_3$ 0.01 parts by mass of platinum-1,1,3,3-tetramethyl-1,3-divinyldisiloxane complex in excess the disiloxane (platinum content is 4.5% by mass), 0.05 parts by mass of 1-ethynylcyclohexan-1-ol, and 0.5 parts by mass of epoxy-functional organopolysiloxane resin represented by the following average unit formula:

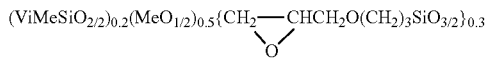

$(ViMeSiO_{2/2})_{0.2}(MeO_{1/2})_{0.5}\{CH_2\text{—}CHCH_2O(CH_2)_3SiO_{3/2}\}_{0.3}$ (with epoxide O bridging)

85 parts by mass of the obtained composition were added 15 parts by mass of mesitylene as a solvent, and the mixture was coated in 100 μm in thickness on a PET film followed by heating at 120° C. for 30 minutes. The film supported on the PET film was tackfree at 25° C. and peeled off from the PET film to afford the free-standing film. However, the film placed on an aluminum plate was difficult to melt at 100° C. and 150° C. to stick to the aluminum plate.

Comparative Example 3

A reactive silicone composition was prepared by mixing: 37.4 parts by mass of an organopolysiloxane resin represented by the following average unit formula:

$(ViMe_2SiO_{1/2})_{0.04}(Me_3SiO_{1/2})_{0.40}(SiO_{4/2})_{0.56}(HO)_{0.02}$ 32.5 parts by mass of an organopolysiloxane resin represented by the following average unit formula:

$(Me_3SiO_{1/2})_{0.44}(SiO_{4/2})_{0.56}(HO_{1/2})_{0.02}$ 22.4 parts by mass of a diorganopolysiloxane represented by the following average formula:

$ViMe_2SiO(Me_2SiO)_{800}SiMe_2Vi$ 5.1 parts by mass of a diorganopolysiloxane represented by the following average formula:

$ViMe_2SiO(Me_2SiO)_{45}SiMe_2Vi$ 2.2 parts by mass of an organohydrogenpolysiloxane represented by the following average formula:

$HMe_2SiO(Me_2SiO)_{17}SiMe_2H,$ 0.4 parts by mass of an organohydrogenpolysiloxane represented by the following average formula:

$Me_3SiO(MeHSiO)_{55}SiMe_3$ 0.01 parts by mass of platinum-1,1,3,3-tetramethyl-1,3-divinyldisiloxane complex in excess the disiloxane (platinum content is 4.5% by mass), and 0.1 parts by mass of 1-ethynylcyclohexan-1-ol.

30 parts by mass of the obtained composition were added 70 parts by mass of a YAG phosphor (Intematix NYAG4454) and 20 parts by mass of mesitylene, and the mixture was mixed until the uniform mixture was obtained. The solution was coated in 100 μm in thickness on a PET film followed by heating at 120° C. for 15 minutes. The film supported on the PET film was too tacky to peel off from the PET film and cut off to smaller piece by knife.

Comparative Example 4

A reactive silicone composition was prepared by mixing: 37.4 parts by mass of an organopolysiloxane resin represented by the following average unit formula:

$(ViMe_2SiO_{1/2})_{0.15}(Me_3SiO_{1/2})_{0.46}(SiO_{4/2})_{0.39}(HO_{1/2})_{0.08}$ 43.0 parts by mass of an organopolysiloxane resin represented by the following average unit formula:

$(Me_3SiO_{1/2})_{0.44}(SiO_{4/2})_{0.56}(HO_{1/2})_{0.02}$ 2.55 parts by mass of a diorganopolysiloxane represented by the following average formula:

$ViMe_2SiO(Me_2SiO)_{800}SiMe_2Vi,$ 2.8 parts by mass of a diorganopolysiloxane represented by the following average formula:

$ViMe_2SiO(Me_2SiO)_{45}SiMe_2Vi,$ 14.0 parts by mass of an organohydrogenpolysiloxane represented by the following average formula:

$HMe_2SiO(Me_2SiO)_{17}SiMe_2H,$ 0.25 parts by mass of an organohydrogenpolysiloxane represented by the following average formula:

$Me_3SiO(MeHSiO)_{55}SiMe_3$ 0.01 parts by mass of platinum-1,1,3,3-tetramethyl-1,3-divinyldisiloxane complex in excess the disiloxane (platinum content is 4.5% by mass), and 0.1 parts by mass of 1-ethynylcyclohexan-1-ol.

30 parts by mass of the obtained composition were added 70 parts by mass of a YAG phosphor (Intematix NYAG4454) and 20 parts by mass of mesitylene, and the mixture was mixed until the uniform mixture was obtained. The solution was coated in 100 μm in thickness on a PET film followed by heating at 120° C. for 15 minutes. The film supported on the PET film was tackfree at 25° C. and peeled off from the PET film to afford the free-standing film. However, the film placed on an aluminum plate was difficult to melt at 100° C. and 150° C. to stick to the aluminum plate.

Comparative Example 5

A reactive silicone composition was prepared by mixing: 32.5 parts by mass of an organopolysiloxane resin represented by the following average unit formula:

$(ViMe_2SiO_{1/2})_{0.11}(Me_3SiO_{1/2})_{0.33}(SiO_{4/2})_{0.56}(HO_{1/2})_{0.02}$ 32.5 parts by mass of an organopolysiloxane resin represented by the following average unit formula:

$(Me_3SiO_{1/2})_{0.44}(SiO_{4/2})_{0.56}(HO_{1/2})_{0.02}$ 30.6 parts by mass of a diorganopolysiloxane represented by the following average formula:

$Me_3SiO(Me_2SiO)_{789}(MeViSiO)_{11}SiMe_3$ 1.4 parts by mass of an organohydrogenpolysiloxane represented by the following average formula:

$HMe_2SiO(Me_2SiO)_{17}SiMe_2H$ 3.0 parts by mass of an organohydrogenpolysiloxane represented by the following average formula:

$Me_3SiO(MeHSiO)_7(Me_2SiO)_{6.5}SiMe_3$ 0.01 parts by mass of platinum-1,1,3,3-tetramethyl-1,3-divinyldisiloxane complex in excess the disiloxane (platinum content is 4.5% by mass), 0.05 parts by mass of 1-ethynylcyclohexan-1-ol, and 0.5 parts by mass of epoxy-functional organopolysiloxane resin represented by the following average unit formula:

$$(ViMeSiO_{2/2})_{0.2}(MeO_{1/2})_{0.5}\{CH_2\overset{O}{\underset{\diagdown\diagup}{-}}CHCH_2O(CH_2)_3SiO_{3/2}\}_{0.3}$$

85 parts by mass of the obtained composition were added 15 parts by mass of mesitylene as a solvent, and the mixture was coated in 100 μm in thickness on a PET film followed by heating at 120° C. for 30 minutes. The film supported on the PET film was tackfree at 25° C. and peeled off from the PET film to afford the free-standing film. However, the film placed on an aluminum plate was difficult to melt at 100° C. and 150° C. to stick to the aluminum plate.

Comparative Example 6

A reactive silicone composition was prepared by mixing: 32.5 parts by mass of an organopolysiloxane resin represented by the following average unit formula:

$$(ViMe_2SiO_{1/2})_{0.11}(Me_3SiO_{1/2})_{0.33}(SiO_{4/2})_{0.56}(HO_{1/2})_{0.02}$$

32.5 parts by mass of an organopolysiloxane resin represented by the following average unit formula:

$$(Me_3SiO_{1/2})_{0.44}(SiO_{4/2})_{0.56}(HO_{1/2})_{0.02}$$

11.0 parts by mass of a diorganopolysiloxane represented by the following average formula:

$$Me_3SiO(Me_2SiO)_{789}(MeViSiO)_{11}SiMe_3$$

24.0 parts by mass of an organohydrogenpolysiloxane represented by the following average formula:

$$HMe_2SiO(Me_2SiO)_{17}SiMe_2H$$

0.01 parts by mass of platinum-1,1,3,3-tetramethyl-1,3-divinyldisiloxane complex in excess the disiloxane (platinum content is 4.5% by mass), 0.05 parts by mass of 1-ethynyl-cyclohexan-1-ol, and 0.5 parts by mass of epoxy-functional organopolysiloxane resin represented by the following average unit formula:

$$(ViMeSiO_{2/2})_{0.2}(MeO_{1/2})_{0.5}\{CH_2\overset{O}{\underset{\diagdown\diagup}{-}}CHCH_2O(CH_2)_3SiO_{3/2}\}_{0.3}$$

85 parts by mass of the obtained composition were added 15 parts by mass of mesitylene as a solvent, and the mixture was coated in 100 μm in thickness on a PET film followed by heating at 120° C. for 30 minutes. The film supported on the PET film was tackfree at 25° C. and peeled off from the PET film to afford the free-standing film. However, the film placed on an aluminum plate was difficult to melt at 100° C. and 150° C. to stick to the aluminum plate.

Comparative Example 7

A curable hotmelt composition was prepared by adding 3.5 parts by mass of an organohydrogenpolysiloxane represented by the following average formula:

$$Me_3SiO(MeHSiO)_{55}SiMe_3$$

to a mixture of 105.1 parts by mass of the hot melt material of Comparative Example 1 prepared by reaction of the reactive silicone composition in Comparative Example 1 at 100° C. for 2 hours and 27.0 parts by mass of mesitylene.

The mixture was coated in 100 μm in thickness on a PET film followed by heating at 120° C. for 30 minutes. The film supported on the PET film was tackfree at 25° C. and peeled off from the PET film to afford the free-standing film. The film placed on an aluminum plate was molten at 150° C. followed by curing. The resulting film was sticked well to the aluminum plate at 150° C. as well as at room temperature. However, the film placed on an aluminum plate was difficult to melt at 100° C. and 150° C. to stick to the aluminum plate.

Comparative Example 8

A curable hotmelt composition was prepared by adding 0.6 parts by mass of an organohydrogenpolysiloxane represented by the following average formula:

$$Me_3SiO(MeHSiO)_{55}SiMe_3$$

to a mixture of 105.1 parts by mass of the hot melt material of Comparative Example 2 prepared by reaction of the reactive silicone composition in Comparative Example 2 at 100° C. for 2 hours and 27.0 parts by mass of mesitylene.

The mixture was coated in 100 μm in thickness on a PET film followed by heating at 120° C. for 30 minutes. The film supported on the PET film was tackfree at 25° C. and peeled off from the PET film to afford the free-standing film. However, the film placed on an aluminum plate was difficult to melt at 100° C. and 150° C. to stick to the aluminum plate. In addition, the film readily was deformed at 150° C.

INDUSTRIAL APPLICABILITY

The reactive silicone composition of the present invention is suitable for use as adhesives, potting agents, protective agents, or underfills in electrical and electronic applications. In particular, since the composition has high light transmittance, the composition is suitable for use as adhesives, potting agents, protective agents, coating agents, or underfills in optical semiconductor devices.

The invention claimed is:
1. A reactive silicone composition for forming a hotmelt material, comprising:
(A) an organopolysiloxane resin represented by the following average unit formula:

$$(R^1_3SiO_{1/2})_a(R^1_2SiO_{2/2})_b(R^1SiO_{3/2})_c(SiO_{4/2})_d(R^2O_{1/2})_e$$

wherein each $R^1$ independently is a monovalent hydrocarbon group having 1 to 10 carbon atoms, with the proviso that 4 to 12 mol % of all $R^1$ in a molecule are alkenyl groups; $R^2$ is a hydrogen atom or an alkyl group having 1 to 10 carbon atoms; and a, b, c, d, and e are numbers that satisfy: $0.35 \leq a \leq 0.60$; $0 \leq b \leq 0.1$; $0 \leq c \leq 0.1$; $0.40 \leq d \leq 0.65$; $0 \leq e \leq 0.05$; and $a+b+c+d=1$, in an amount of 15 to 50% by mass of total amount of components (A) to (C);
(B) an organopolysiloxane resin represented by the following average unit formula:

$$(R^3_3SiO_{1/2})_f(R^3_2SiO_{2/2})_g(R^3SiO_{3/2})_h(SiO_{4/2})_i(R^4O_{1/2})_j$$

wherein each $R^3$ independently is a monovalent hydrocarbon group having 1 to 10 carbon atoms except for an alkenyl group; $R^4$ is a hydrogen atom or an alkyl group having 1 to 10 carbon atoms; and f, g, h, i, and j are numbers that satisfy: $0.35 \leq f \leq 0.55$; $0 \leq g \leq 0.2$; $0 \leq h \leq 0.2$; $0.45 \leq i \leq 0.65$; $0 \leq j \leq 0.05$; and $f+g+h+i=1$, in an amount of 20 to 45% by mass of total amount of components (A) to (C);
(C) a diorganopolysiloxane represented by the following average formula:

$$R^5_3SiO(SiR^5_2O)_kSiR^5_3$$

wherein each $R^5$ independently is a monovalent hydrocarbon group having 1 to 10 carbon atoms, with the proviso that at least two $R^5$ in a molecule are alkenyl groups; and k is a number of 20 to 5,000, in an amount of 10 to 40% by mass of total amount of components (A) to (C);

(D) an organohydrogenpolysiloxane having two silicon-bonded hydrogen atoms in a molecule, in an amount that component (D) gives 0.1 to 0.6 silicon-bonded hydrogen atoms per one alkenyl group in components (A) and (C);

(E) an organohydrogenpolysiloxane having at least three silicon-bonded hydrogen atoms in a molecule, in an amount that component (E) gives 0.1 to 0.5 silicon-bonded hydrogen atoms per one alkenyl group in components (A) and (C); and (F) a hydrosilylation catalyst in a sufficient amount to conduct a hydrosilylation of the composition.

2. The reactive silicone composition according to claim 1, further comprising (G) a phosphor, in an amount of 10 to 400 parts by mass per 100 parts by mass of the sum of components (A) to (F).

3. A hotmelt material obtained by conducting a hydrosilylation reaction of the composition according to claim 1.

4. A curable hotmelt composition comprising: the hotmelt material obtained by conducting a hydrosilylation reaction of the reactive silicone composition according to claim 1, and (H) an organohydrogenpolysiloxane having at least two silicon-bonded hydrogen atoms in a molecule, in an amount that component (H) gives 0.1 to 0.8 silicon-bonded hydrogen atoms per one alkenyl group in components (A) and (C) in the reactive silicone composition.

5. A hotmelt material obtained by conducting a hydrosilylation reaction of the composition according to claim 2.

6. A curable hotmelt composition comprising: the hotmelt material obtained by conducting a hydrosilylation reaction of the reactive silicone composition according to claim 2, and (H) an organohydrogenpolysiloxane having at least two silicon-bonded hydrogen atoms in a molecule, in an amount that component (H) gives 0.1 to 0.8 silicon-bonded hydrogen atoms per one alkenyl group in components (A) and (C) in the reactive silicone composition.

\* \* \* \* \*